(12) United States Patent
Takamura et al.

(10) Patent No.: US 7,579,698 B2
(45) Date of Patent: Aug. 25, 2009

(54) PHOTODETECTOR SEALING RESIN IS A BORIDE OR AN OXIDE OF MICRO PARTICLES

(75) Inventors: Fumio Takamura, Kamifukuoka (JP); Seiji Koike, Kamifukuoka (JP)

(73) Assignee: New Japan Radio Co., Ltd., Tokyo (JP)

( * ) Notice: Subject to any disclaimer, the term of this patent is extended or adjusted under 35 U.S.C. 154(b) by 11 days.

(21) Appl. No.: 11/332,205

(22) Filed: Jan. 17, 2006

(65) Prior Publication Data
US 2006/0157727 A1 Jul. 20, 2006

(30) Foreign Application Priority Data
Jan. 20, 2005 (JP) .............................. 2005-012885

(51) Int. Cl.
*H01L 23/29* (2006.01)
(52) U.S. Cl. .................... 257/791; 257/788; 257/789; 257/795; 257/E25.032
(58) Field of Classification Search .......... 257/E25.032, 257/791, 788, 789, 795
See application file for complete search history.

(56) References Cited

U.S. PATENT DOCUMENTS 3,896,313 A * 7/1975 Berman et al. ............. 250/372
6,013,935 A * 1/2000 Shie ........................... 257/469
6,221,945 B1 * 4/2001 Kuno et al. .................. 524/401
6,277,187 B1 * 8/2001 Kuno et al. ............. 106/287.16
6,476,374 B1 * 11/2002 Kozlowski et al. ........ 250/214.1
6,633,030 B2 * 10/2003 Joshi ....................... 250/214.1
6,770,956 B2 * 8/2004 Fujimoto et al. ............. 257/659

FOREIGN PATENT DOCUMENTS

JP 9-15044 1/1997

OTHER PUBLICATIONS

Machine translation of JP-9-15044, 5 pages.*

* cited by examiner

*Primary Examiner*—Bradley K Smith
*Assistant Examiner*—Alexander Belousov
(74) *Attorney, Agent, or Firm*—Antonelli, Terry, Stout & Kraus, LLP.

(57) ABSTRACT

A semiconductor photodetector which can achieve spectral sensitivity characteristics close to relative luminous characteristics at low cost while using a light receiving element of a semiconductor made from such as silicon, has a semiconductor light receiving element having high spectral sensitivity in a wavelength range between approximately 400 nm to 1100 nm and an optical transmitting resin for sealing at least a light receiving surface of the semiconductor light receiving element. The optical transmitting resin is formed by dispersing metal boride micro particles whose particle diameter is not more than approximately 100 nm in a transparent resin and blocks light in wavelengths approximately 700 nm or above.

5 Claims, 6 Drawing Sheets

A = Epoxy Resin 10 : Suspension 0.15
B = Epoxy Resin 10 : Suspension 0.30
C = Epoxy Resin 10 : Suspension 0.50

A = Epoxy Resin 10 : Suspension 0.15
B = Epoxy Resin 10 : Suspension 0.30
C = Epoxy Resin 10 : Suspension 0.50

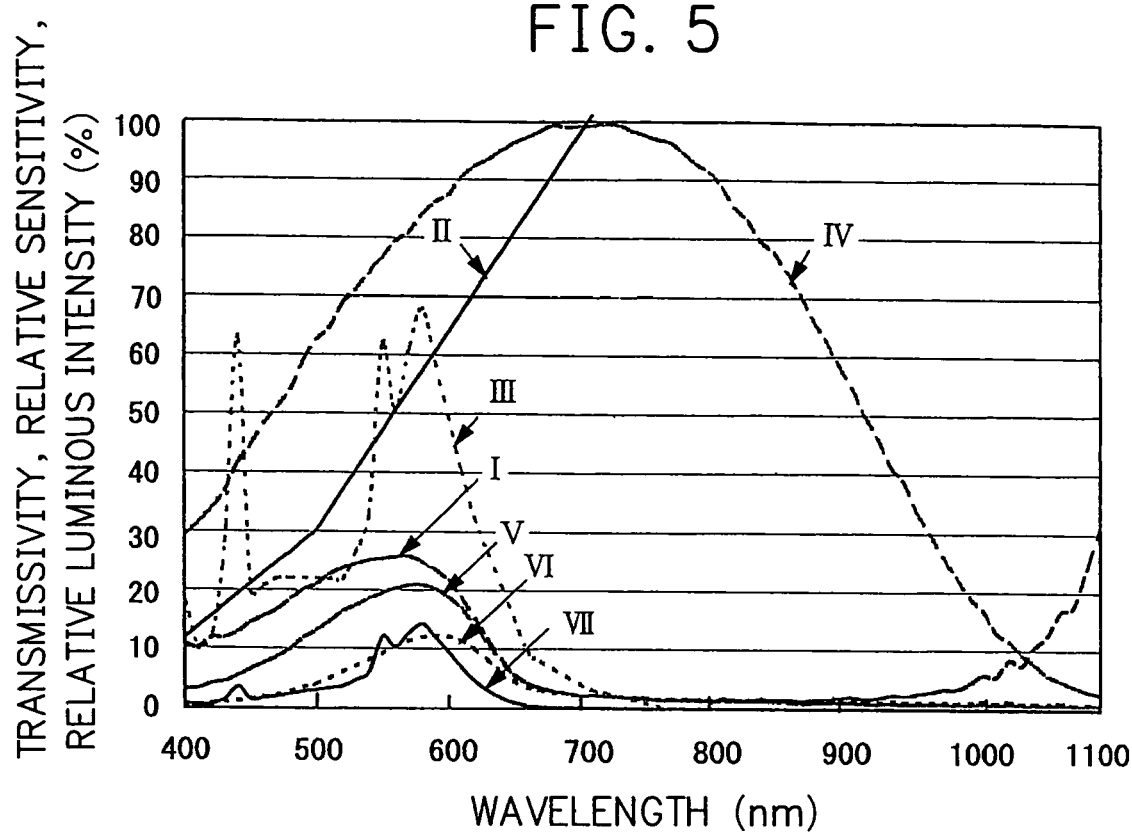

FIG. 5

I = Transmissivity of Resin
II = Relative Luminous Intensity of Incandescent Light
III = Relative Luminous Intensity of Fluorescent Light
IV = Relative Sensitivity of PT
V = Transmissivity of Resin × Relative Sensitivity of PT
VI = Transmissivity of Resin × Relative Sensitivity of PT × Relative Luminous Intensity of Incandescent Light
VII = Transmissivity of Resin × Relative Sensitivity of PT × Relative Luminous Intensity of Fluorescent Light

PHOTODETECTOR SEALING RESIN IS A BORIDE OR AN OXIDE OF MICRO PARTICLES

BACKGROUND OF THE INVENTION

The present invention relates to a semiconductor photodetector whose spectral sensitivity is controlled to the visible light region by a combination of a semiconductor light receiving element having spectral sensitivity from the visible light region to the infrared region and an optical transmitting resin in which micro particles block the infrared region.

As a photodetector, a CdS cell having spectral sensitivity characteristics as shown in FIG. 6 has been widely used. However, since cadmium is high in environmental burdens and falls under a controlled substance by RohS command of EU, cadmium will be prohibited to use within EU from July 2006. As a replacement of cadmium, a photodetector formed from silicon has been used. In order to compose a photodetector with silicon, spectral sensitivity characteristics of silicon (FIG. 7) needs to be coordinated with relative luminous characteristics (FIG. 8) which is sensitivity of human eyes.

In order to achieve this, a filter composed of multilayer film in which an oxide silicon ($SiO_2$) film and a titanium oxide ($TiO_2$) film are alternatively laminated has been provided at a light receiving surface side of a silicon light receiving element to lower spectral sensitivity of the infrared region within the spectral sensitivity of silicon, to thereby approximate to relative luminous characteristics (FIG. 8) in prior art (see, for example Japanese Unexamined Patent Publication No. 15044/1997).

However, formation of the multilayer film in which an oxide silicon ($SiO_2$) film and a titanium oxide ($TiO_2$) film are alternatively laminated is a troublesome task in terms of time and processes, and results in high cost. In other words, the multilayer film is formed by multiple times of vacuum plasma evaporation, and a bonding pad is etched to be open for electrical connection after the formation of the multilayer film. These processes require special techniques in addition to the time consuming processes, thus resulting in high cost.

An object of the present invention is to provide a semiconductor photodetector which can achieve spectral sensitivity characteristics close to relative luminous characteristics at low cost while using a light receiving element of a semiconductor such as silicon.

SUMMARY OF THE INVENTION

A semiconductor photodetector of the invention includes a semiconductor light receiving element having high spectral sensitivity in wavelengths from at least a visible light region to infrared region and an optical transmitting resin for sealing at least a light receiving surface of the semiconductor light receiving element: wherein the optical transmitting resin is boride of one or more elements selected from La, Pr, Nd, Ce, Y, Ti, Zr, Hf, V, Nb, Ta, Cr, Mo or W and is formed by dispersing micro particles whose particle diameter is not more than approximately 100 nm in a transparent resin.

The semiconductor photodetector of the invention can also include instead of boride, or in addition to boride, micro particles of ruthenium oxide and/or iridium oxide whose particle diameter is not more than approximately 100 nm and which are dispersed in the optical transmitting resin.

Further, according to the invention the semiconductor light receiving element of the photodetector includes any one of silicon, gallium arsenide, gallium phosphide or indium phosphide.

As another aspect of the invention, the semiconductor light receiving element of the photodetector has high spectral sensitivity in wavelength ranges approximately between 400 nm to 1100 nm, and light in approximately 700 nm or above in the wavelength ranges is blocked by the optical transmitting resin.

According to a semiconductor photodetector of the present invention, a light receiving surface of a semiconductor light receiving element is sealed by the optical transmitting resin in which boride micro particles whose particle diameter is not more than approximately 100 nm or micro particles of ruthenium oxide or iridium oxide are dispersed. Therefore, spectral sensitivity of the semiconductor photodetector is close to that of a conventional CdS that is highly sensitive to wavelengths in the visible light region and has low sensitivity to wavelengths in the infrared region, in other words, it is possible to obtain characteristics close to relative luminous characteristics. Furthermore, since only a step of dispersing micro particles in a resin for sealing is added and other steps are still the same as conventional steps, the semiconductor photodetector can be advantageously fabricated with small increase of cost. The semiconductor photodetector of the present invention can be used as a detector for controlling liquid crystal backlight of such as portable devices (such as cellular phones and PDA) and personal computers, for controlling automatic lighting of such as house light and security light, for controlling electric flash of cameras or for controlling other devices.

BRIEF DESCRIPTION OF THE DRAWINGS

FIG. 5 is a characteristic diagram of such as transmissivity of resin, relative luminous intensity of incandescent light and fluorescent light and relative sensitivity of phototransistor (PT);

DETAILED DESCRIPTION

Figure 7:
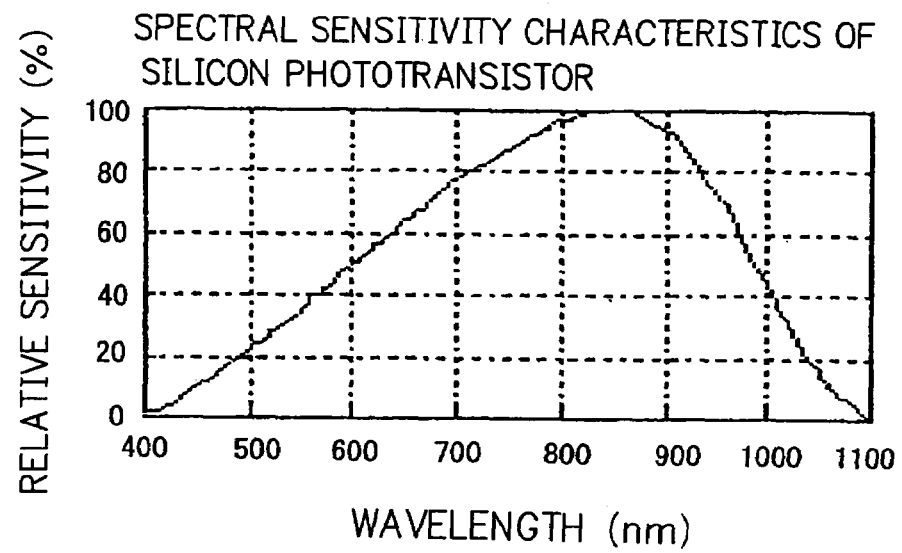
FIG. 7 is a diagram showing spectral sensitivity characteristics of a silicon phototransistor.
Figure 8:
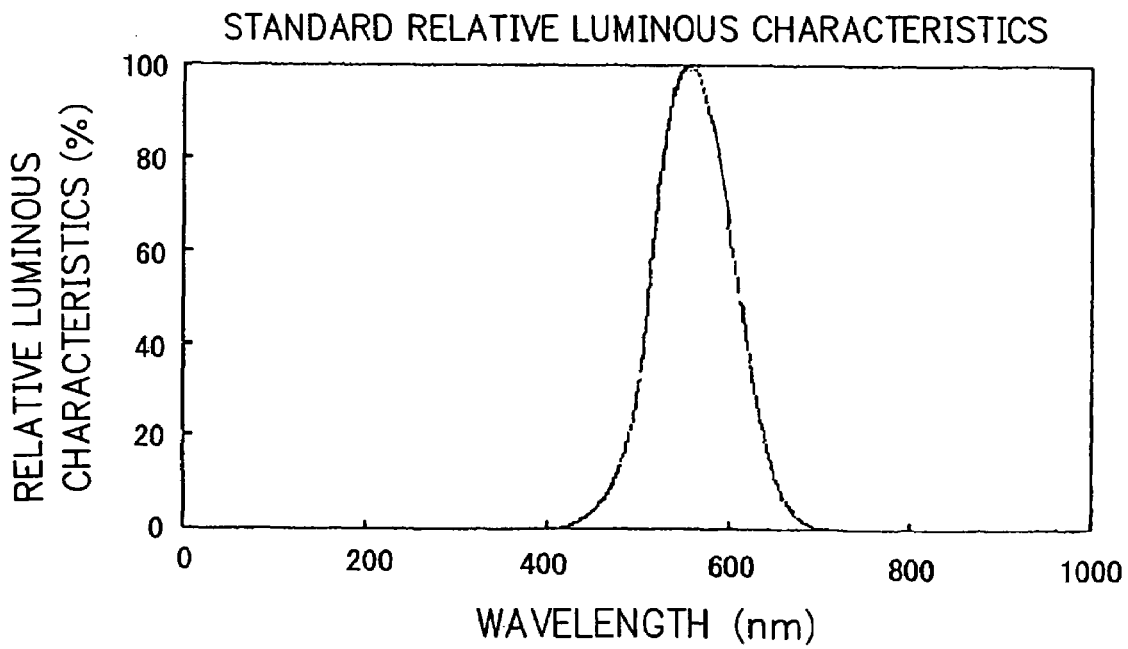
FIG. 8 is a diagram showing standard relative luminous characteristics.

In the present invention, a semiconductor light receiving element is composed of a compound semiconductor such as silicon or gallium arsenide, gallium phosphide, indium phosphide, and a material with high spectral sensitivity at least from the visible light region to the infrared region (a material with characteristics shown in FIG. 7) is used. As an optical transmitting resin for sealing a light receiving surface of the semiconductor light receiving element, a transparent resin (for example an epoxy resin) in which micro particles of such as lanthanum boride ($LaB_6$) whose particle diameter is not more than approximately 100 nm are dispersed is used.

A reason for selecting such as lanthanum boride is that it has high light blocking characteristics for wavelengths in the infrared region compared to other metal oxide. When fluorescent light or sunlight enters inside an optical transmitting resin in which micro particles of lanthanum boride are diffused and encounters lanthanum boride, electromagnetic waves at frequencies lower than plasma frequencies of lanthanum boride cause total reflection. Hereat, plasma frequency is the number of frequencies of free electrons generated by loose density of electron distribution of a solid substance. Electromagnetic waves at higher frequency than the frequency of plasma frequency pass through and electromagnetic waves at lower frequency are totally reflected. In the case of lanthanum boride, wavelengths of frequency causing total reflection are present in the infrared region.

A reason for selecting micro particles whose particle diameter is not more than approximately 100 nm is to suppress visible light (wavelengths between 400 to 700 nm) to be reflected by scattering. In other words, when a particle diameter of a micro particle is less than the wavelengths of visible light, light scattering by the micro particle becomes mainly Rayleigh scattering. The scattering enlarges in proportion to the square of the particle volume, namely the sextuplicate of the particle diameter. Therefore, a smaller particle diameter results in a sharp reduction in scattering, thereby transparency relative to the visible light is increased. The transparency relative to visible light can be obtained by particle diameters less than ¼ of the wavelengths in visible light (approximately less than 100 nm).

As described above, micro particles such as lanthanum boride ($LaB_6$) whose particle diameter is not more than approximately 100 nm have particular characteristics that block light at wavelengths in the infrared region and transmit light in the visible light region whose wavelengths are shorter than that of the infrared region when micro particles are dispersed in the transparent resin.

As micro particles dispersed in the transparent resin, boride micro particles of such as praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$) or tungsten boride ($W_2B_5$) are typically used besides the above-mentioned lanthanum boride ($LaB_6$), and one or two or more of those can be used.

Furthermore, instead of those boride micro particles or in addition to those boride micro particles, ruthenium oxide micro particles or iridium oxide micro particles may be added. Typical examples of oxide micro particles are micro particles of ruthenium dioxide ($RuO_2$), lead ruthenate ($Pb_2Ru_2O_{6.5}$), bismuth ruthenate ($Bi_2Ru_2O_7$), iridium dioxide ($IrO_2$), bismuth iridate ($Bi_2Ir_2O_7$) and lead iridate ($Pb_2Ir_2O_{6.5}$). Micro particles of ruthenium oxide or iridium oxide are stable oxide, have a large amount of free electrons and are high in blocking characteristics of the infrared region.

The above-described boride micro particles and oxide micro particles are also superior in heat resistance. Therefore, degradation of blocking characteristics of infrared light is not recognized in the case heat is applied for reflow soldering which is required to mount a semiconductor device.

The micro particles are suspended in an organic solvent such as toluene and dispersed in a resin for sealing. In the case of using micro particles of lanthanum boride ($LaB_6$), 1.85% by weight of the lanthanum boride micro particles is suspended in toluene. Hereat, a surface active agent or coupling agent may be used as required. By adding the suspension prepared as the above-mentioned manner in the resin for sealing and agitating, sealing resin (optical transmitting resin) used in the present invention is prepared. The amount of the suspension to be added is properly determined in accordance with a thickness of the resin formed on the surface of the light receiving element or required blocking characteristics. Toluene being a solvent evaporates during a step of sealing resin such that only lanthanum boride micro particles dispersedly remain in the sealing resin in the end.

Figure 4:
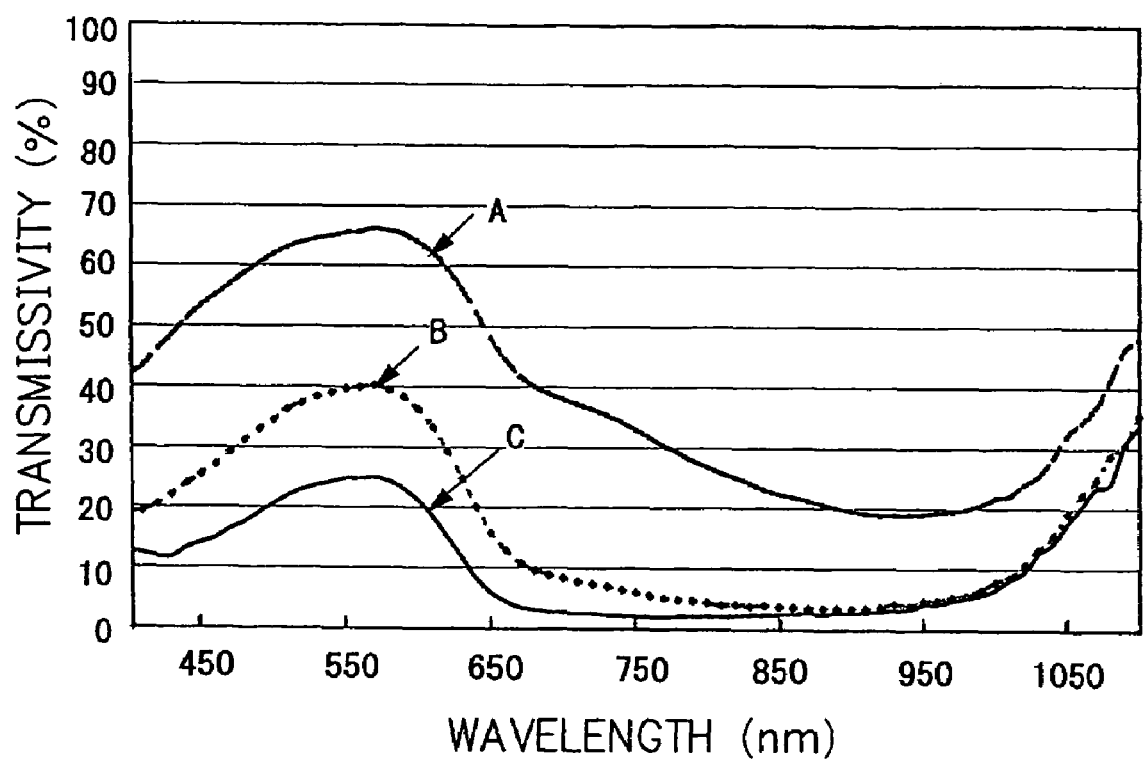
FIG. 4 is a characteristic diagram of transmissivity of an epoxy resin in which lanthanum boride micro particles are dispersed.
Figure 6:
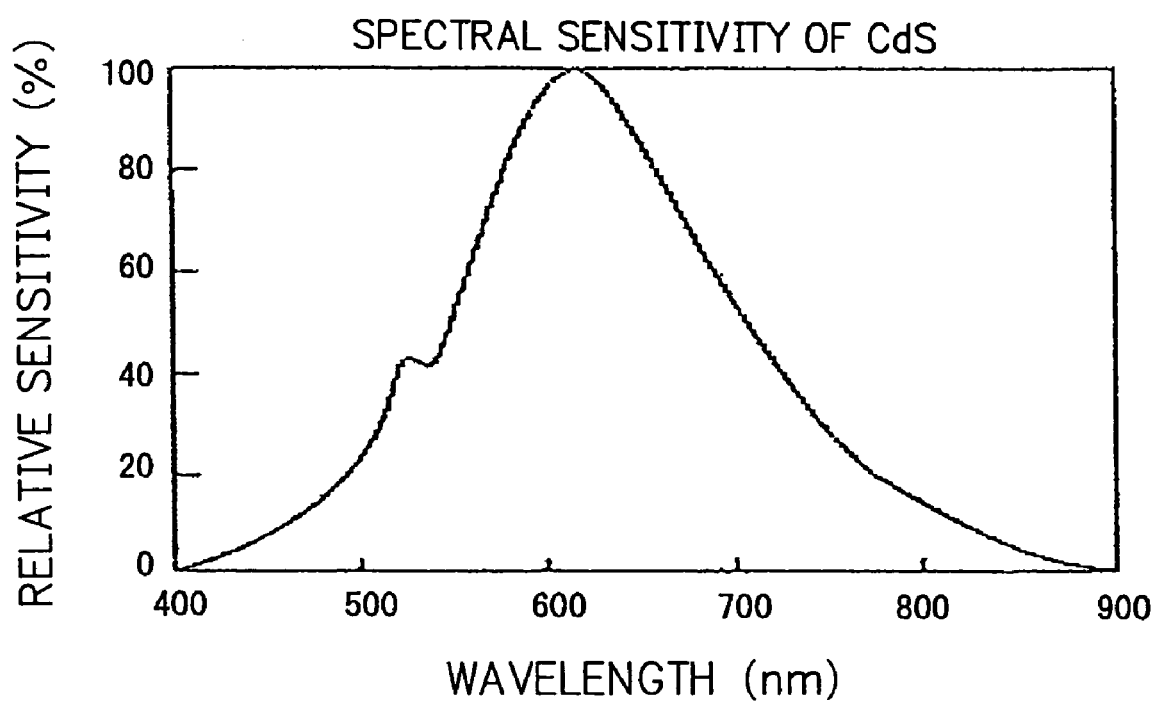
FIG. 6 is a diagram showing spectral sensitivity characteristics of CdS.

FIG. 4 is a characteristic diagram showing the transmissivity of the optical transmitting resin prepared by adding the suspension with 1.85% by weight of lanthanum boride micro particles to epoxy resin at a ratio of 10:0.15 (A), a ratio of 10:0.30 (B) and a ratio of 10:0.50 (C). The diagram shows high transmissivity, above 20% transmissivity over at least a portion of the wavelength range in wavelengths at visible light (400 nm to 700 nm) and low transmissivity at the infrared region of 700 nm to 1000 nm for all cases. As shown in FIG. 4, for ratios B and C the optical transmitting resin blocks light such that the transmissivity of the resin to light having a wavelength within the range of 700 nm to 1100 nm is less than 10% transmissivity over at least most of the wavelength range.

FIG. 5 is a characteristic diagram showing the case of using the optical transmitting resin at the ratio of 10:0.50 (C) of FIG. 4. As a semiconductor light receiving element, a phototransistor (PT) formed from silicon having spectral sensitivity in wavelengths between 400 nm to 1100 nm (characteristic IV) was used. A characteristic (V) which is a combination of relative sensitivity of the phototransistor (PT) and the transmissivity of the optical transmitting resin has high spectral sensitivity in wavelengths between 400 nm to 700 nm and low sensitivity in wavelengths above 700 nm. Therefore, the characteristic (VI) in the case of receiving incandescent light and the characteristic (VII) in the case of receiving fluorescent light are similar to the above-described characteristic.

Example 1

Figure 1:
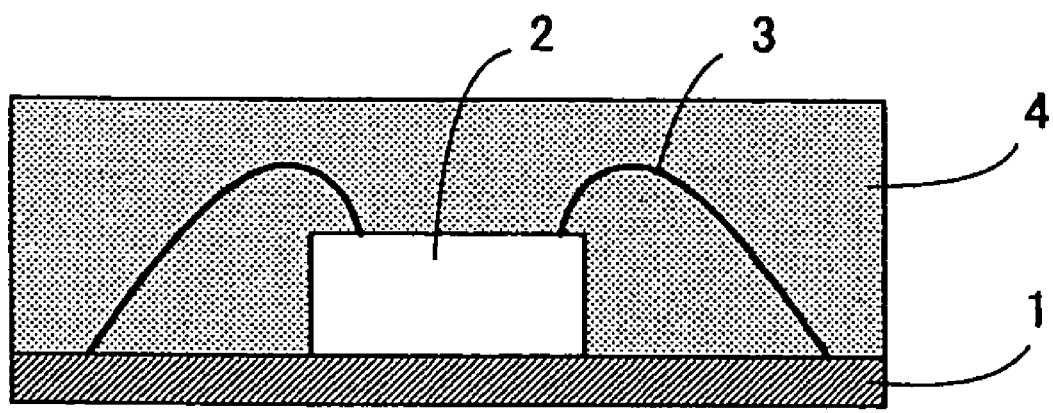
FIG. 1 is a cross-sectional view of a semiconductor photodetector according to Example 1 of the present invention.

FIG. 1 is a sectional view showing a semiconductor photodetector according to Example 1 of the present invention. In order to make the semiconductor photodetector, a plurality of semiconductor light receiving elements are mounted on an integrated substrate, and optical transmitting resin of the present invention in which lanthanum boride micro particles are dispersed is applied thereon. After the optical transmitting resin is hardened, the resin is cut into several parts by a dicing blade to form a semiconductor photodetector. In FIG. 1, numeral 1 is a cut substrate, 2 is a semiconductor light receiving element, 3 is a metal wire and 4 is an optical transmitting resin in which boride micro particles are dispersed.

Example 2

Figure 2:
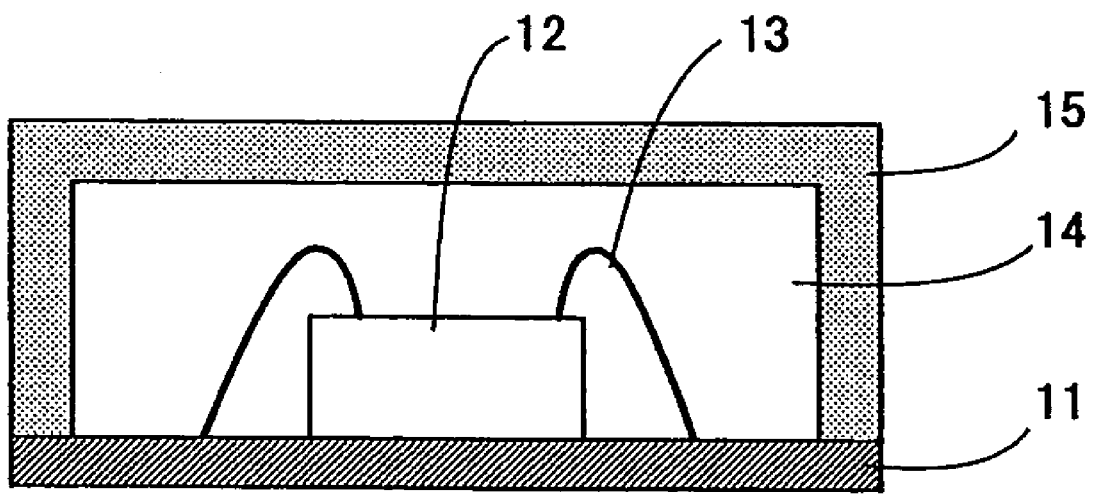
FIG. 2 is a cross-sectional view of a semiconductor photodetector according to Example 2 of the present invention.

FIG. 2 is a sectional view showing a semiconductor photodetector according to Example 2 of the present invention. In order to prepare the semiconductor photodetector, a first optical transmitting resin (transparent resin not containing boride micro particles) is applied on an entire surface. After the first optical transmitting resin is hardened, a groove is formed between adjacent photo microchips by using a dicing blade. Then, a second optical transmitting resin (resin of the present invention in which boride micro particles are dispersed) is applied on an entire surface of the first optical transmitting resin to be hardened. A semiconductor photodetector is formed by cutting a center of the groove into several parts using a dicing blade. In FIG. 2, numeral 11 is a cut substrate, 12 is a semiconductor light receiving element, 13 is a metal wire, 14 is the first optical transmitting resin and 15 is the second optical transmitting resin.

Figure 3A:
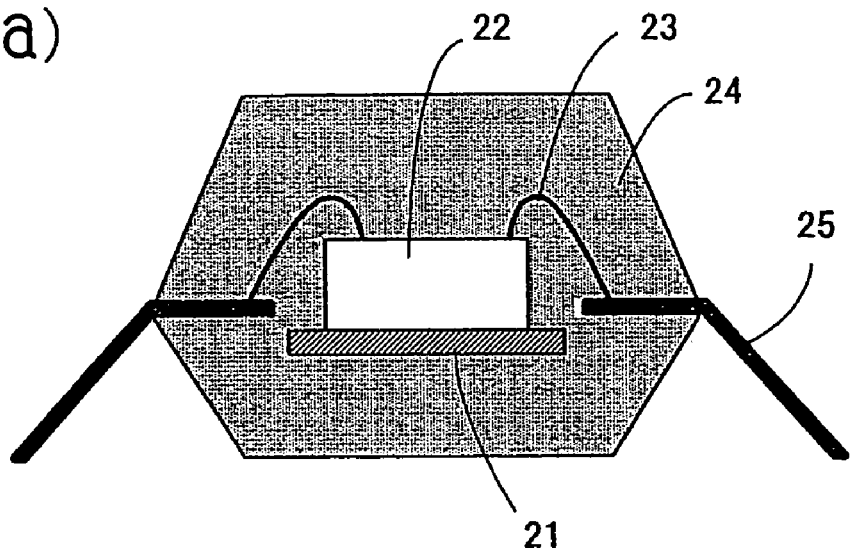
FIGS. 3(a) and 3(b) are cross-sectional views of a semiconductor photodetector according to Example 3 of the present invention.
Figure 3B:
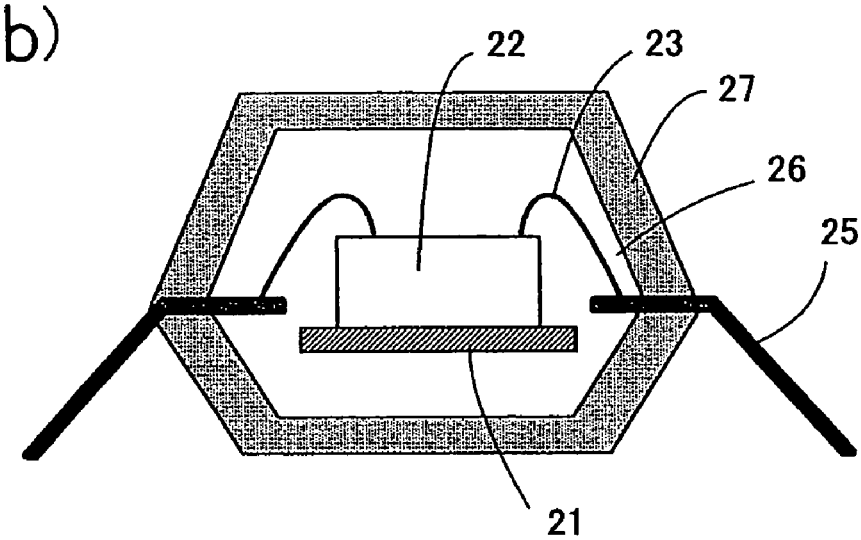

FIG. 3(*a*) is a cross-sectional view of the semiconductor photodetector of Example 2. In order to prepare the semiconductor photodetector, a resin pellet which is formed by dispersing boride micro particles in resin for transfer molding is prepared in advance. The resin of the semiconductor light receiving element is sealed by using the resin pellet. In FIG. 3(*a*), numeral 21 is a substrate, 22 is a semiconductor light receiving element, 23 is a metal wire, 24 is a sealed optical transmitting resin and 25 is a lead. In the manner as shown in FIG. 3(*b*), the semiconductor photodetector can be a double resin sealing structure formed by sealing the semiconductor light receiving element 22 by a resin 26 not containing boride micro particles and sealing its exterior by an optical transmitting resin 27 in which boride micro particles are dispersed.

What is claimed is:

1. A semiconductor photodetector including a semiconductor light receiving element having a light receiving surface and having spectral sensitivity in wavelengths from at least a visible light region to infrared region in wavelength ranges approximately between 400 nm to 1100 nm, and an optical transmitting resin for sealing at least the light receiving surface of the semiconductor light receiving element, said optical transmitting resin having a transmissivity to light in the visible light region greater than 20% over at least a portion of the wavelength range between 400 nm and 700 nm and blocking light in the infrared region such that the transmissivity of the resin is less than 10% over at least most of the wavelength range of 700 nm to 1100 nm:
   wherein said optical transmitting resin is boride of one or more elements selected from La, Pr, Nd, Ce, Y, Ti, Zr, Hf, V, Nb, Ta, Cr, Mo or W and is formed by dispersing micro particles whose particle diameter is not more than approximately 100 nm in a transparent resin.

2. The semiconductor photodetector according to claim 1, further including micro particles of at least one of ruthenium oxide and iridium oxide whose particle diameter is not more than approximately 100 nm and which are dispersed in said optical transmitting resin.

3. A semiconductor photodetector including a semiconductor light receiving element having a light receiving surface and having spectral sensitivity in wavelengths from at least a visible light region to infrared region in wavelength ranges approximately between 400 nm to 1100 nm and an optical transmitting resin for sealing at least the light receiving surface of the semiconductor light receiving element, said optical transmitting resin having a transmissivity to light in the visible light region greater than 20% over at least a portion of the wavelength range between 400 nm and 700 nm and blocking light in the infrared region such that the transmissivity of the resin is less than 10% over at least most of the wavelength range of 700 nm to 1100 nm:
   wherein said optical transmitting resin is at least one of ruthenium oxide and iridium oxide and is formed by dispersing micro particles whose particle diameter is not more than approximately 100 nm in a transparent resin.

4. The semiconductor photodetector according to claim 1, wherein said optical transmitting resin is formed by dispersing said micro particles suspended in an organic solvent in an epoxy resin.

5. The semiconductor photodetector according to claim 3, wherein said optical transmitting resin is formed by dispersing said micro particles suspended in an organic solvent in an epoxy resin.

* * * * *